(12) United States Patent
Ehrenreich et al.

(10) Patent No.: US 7,921,388 B2
(45) Date of Patent: *Apr. 5, 2011

(54) WORDLINE BOOSTER DESIGN STRUCTURE AND METHOD OF OPERATING A WORDINE BOOSTER CIRCUIT

(75) Inventors: Sebastian Ehrenreich, Schoenau (DE); Juergen Pille, Stuttgart (DE); Otto Torreiter, Leinfelden-Echterdingen (DE)

(73) Assignee: International Business Machines Corporation, Armonk, NY (US)

( * ) Notice: Subject to any disclaimer, the term of this patent is extended or adjusted under 35 U.S.C. 154(b) by 399 days.

This patent is subject to a terminal disclaimer.

(21) Appl. No.: 11/847,759

(22) Filed: Aug. 30, 2007

(65) Prior Publication Data

US 2008/0068902 A1  Mar. 20, 2008

(30) Foreign Application Priority Data

Sep. 18, 2006 (EP) .................................... 06120846

(51) Int. Cl.
*G06F 17/50* (2006.01)
*G11C 16/06* (2006.01)
(52) U.S. Cl. .................................... 716/100; 365/165.23
(58) Field of Classification Search ................. 716/1–18; 365/185.23
See application file for complete search history.

(56) References Cited

U.S. PATENT DOCUMENTS

2002/0116686 A1 * 8/2002 Shin et al. ......................... 716/2

OTHER PUBLICATIONS

Toru Tanazawa and Shigeru Atsumi, in "Optimization of Word-Line Booster Circuits for Low-Voltage Flash Memories", IEEE Journal of Solid-State Circuits, vol. 34, pp. 1091-1098, Aug. 1999.
John F. Dickson in "On-Chip High-Voltage Generation in MNOS Integrated Circuits using an Improved Voltage Multiplier Technique", IEEE Journal of Solid-State circuits, vol. 11, pp. 374-378, Jun. 1976, where a voltage multiplier technique has been used for generating high supply voltages.
Jae-Youl Lee, Sung-Eun Kim et al. in "A Regulted Charge Pump with Small Ripple Voltage and Fast Start-Up", IEEE Journal of Solid-State Circuits, vol. 41, pp. 425-432, Feb. 2006.
N. Otsuka and M. Horowitz in "Circuit Techniques for 1.5-V Power Supply Flash Memory", IEEE Journal of Solid State Circuits, vol. 32, pp. 1217-1230, Aug. 1997.

\* cited by examiner

*Primary Examiner* — Vuthe Siek
*Assistant Examiner* — Aric Lin
(74) *Attorney, Agent, or Firm* — Michael J. LeStrange (57) ABSTRACT

The invention relates to a wordline booster circuit, especially an SRAM-wordline booster circuit, comprising a driving element (20) for shifting a voltage level of a charge storage element (50) for storing a charge necessary to generate a boosted voltage (Vb), a feedback element (30) for controlling the switching state of a charging element (40), wherein the charging element (40) is actively switchable between a turned-off state during a first time interval and a turned-on state during a second time interval, and an output port (14) for supplying the boost voltage to at least one wordline-driver circuit (100) of a memory device (200). The invention relates also to an operation method for such a wordline booster circuit as well as a memory array implementation on an integrated circuit, especially an SRAM memory array, with a wordline booster circuit.

10 Claims, 5 Drawing Sheets

WORDLINE BOOSTER DESIGN STRUCTURE AND METHOD OF OPERATING A WORDINE BOOSTER CIRCUIT

CROSS REFERENCE TO RELATED APPLICATION

This application is related to a European Patent Application No. 06120846.8, filed Sep. 18, 2006 and Ser. No. 11/847,754 filed contemporaneously with this Application.

FIELD OF THE INVENTION

The invention relates to a design structure for a wordline booster circuit and a design structure for a memory-array with a wordline booster.

The read and write performances of embedded SRAM arrays (SRAM=static random access memory) are a limiting factor for overall system speed. The performance is influenced by different factors, mainly the supply voltage and SRAM cell area.

For high performance applications, large cells and/or high supply voltages are used to meet speed requirements.

Unfortunately, high supply voltages also cause undesirable high power dissipation. Therefore separate voltages are used for SRAM cells and the surrounding logic to meet both, power and performance targets.

The use of large SRAM cells, on the other hand, increases the costs because additional silicon area is needed on the chip, which is expensive and, therefore, undesired. Using a separate supply voltage for the SRAM arrays causes high costs on the system side. First, the voltage has to be generated, which causes costs for a voltage regulator. Second, the voltage has to be distributed to the memory arrays, which causes costs on the packaging side. Additionally, the array supply voltage must track with the surrounding logic supply voltage, in order to ensure cell stability, thus further increasing the costs for voltage regulation. Using on-chip charge-pumps to generate the additional voltage could solve this problem. This solution, however, requires a lot of additional area and power because the charge pump has to keep the increased power level at all times, even during stand-by mode and must be continuously running. Additionally, the increased voltage level causes an increased leakage current in the cells. This makes an efficient charge-pump design difficult, because the leakage current causes a high load at the charge-pump output, thus reducing the overall efficiency.

Various wordline booster circuits are known in the art for flash memories.

A capacitor-switched word-line booster circuit and a so called Dickson charge-pump circuit is proposed by Toru Tanazawa and Shigeru Atsumi, in "Optimization of Word-Line Booster Circuits for Low-Voltage Flash Memories", IEEE Journal of Solid-State Circuits, vol. 34, pp. 1091-1098, August 1999. For lower voltage operation of the memory, the Dickson booster circuit takes advantage of lower power, smaller circuit area, and shorter bit-line delay but has the disadvantage of a finite standby current over the capacitor-switched booster circuit. A key factor to determine which booster circuit is best for low-voltage, low-power flash memory is a duty ratio of the active period to the total period of the device.

The Dickson charge-pump circuit is described in detail in the paper of John F. Dickson in "On-Chip High-Voltage Generation in MNOS Integrated Circuits using an Improved Voltage Multiplier Technique", IEEE Journal of Solid-State Circuits, vol. 11, pp. 374-378, June 1976, where a voltage multiplier technique has been used for generating high supply voltages implemented in a metal nitride oxide semiconductor (NMOS) technology.

A regulated charge pump in CMOS technology is described by Jae-Youl Lee, Sung-Eun Kim et al. in "A Regulated Charge Pump with Small Ripple Voltage and Fast Start-Up", IEEE Journal of Solid-State Circuits, vol. 41, pp. 425-432, February 2006, where the charge pump adopts the automatic pumping current control scheme and automatic frequency scheme.

Circuit techniques for a flash memory which is operated with a power supply voltage Vdd of 1.5 V are described by N. Otsuka and M. Horowitz in "Circuit Techniques for 1.5-V Power Supply Flash Memory", IEEE Journal of Solid-State Circuits, vol. 32, pp. 1217-1230, August 1997. Two types of level shifters are proposed which convert Vdd level signals into the high voltage signals needed for high performance, and a self-bias bit-line voltage sensing scheme is described for improving the read performance at low Vdd levels.

However, in flash memories, which are based on a tunnel effect through an energy gap of their semiconductor-oxide junctions, the boosted high voltage is necessary for operating the memory-devices. The boosted voltage is necessary for a rather long operating time during writing a memory cell, which is typically in the range of microseconds up to milliseconds. Other than that SRAM memories run much faster than flash memory devices and typically are operated in the GHz range. Therefore, it is necessary to provide a boosted voltage in a very short time. Flash memories are much slower and, therefore, their booster circuit can be slower, too.

SUMMARY OF THE INVENTION

It is therefore an object of the invention to provide a design structure for a wordline booster circuit and which provides an improved read and write performance with small power consumption especially useful for SRAM circuits. Another object is to provide a design structure for a memory array with a wordline booster circuit.

An exemplary version of this design structure would be a circuit comprising a driving element for shifting a voltage level of a charge storage element for storing at least a part of a charge necessary to generate a boosted voltage (Vb), a feedback element for controlling the switching state of a charging element, wherein the charging element is actively switchable between a turned-off state during a first time interval and a turned-on state during a second time interval, and an output port for supplying the boost voltage (Vb) to at least one wordline-driver circuit of a memory device.

These objects are achieved by the features of the independent claims. The other claims and the description disclose advantageous embodiments of the comparator circuit and the method operating a comparator circuit according to the invention.

BRIEF DESCRIPTION OF THE DRAWINGS

The present invention together with the above-mentioned and other objects and advantages may best be understood from the following detailed description of the embodiments, but not restricted to the embodiments, wherein is shown in.

In the drawings identical elements or elements with identical functions are referred to with the same reference numeral.

DETAILED DESCRIPTION

A wordline booster circuit is proposed which comprises a driving element for shifting a voltage level of a charge storage element for storing a charge necessary to generate a boosted voltage, a feedback element for controlling the switching state of a charging element, wherein the charging element is actively switchable between a turned-off state during a first time interval and a turned-on state during a second time interval, and an output port for supplying the boost voltage to at least one wordline-driver circuit of a memory device. The wordline booster circuit increases the voltage used for the wordline above the supply voltage level. Only the level for the wordline is increased. Preferably, the boosted output voltage of the circuit is supplied to all wordline-driver circuits. The boosted voltage is available at the negative edge of a clock input signal fed to the wordline booster circuit. At the same time, one of the wordline drivers will be activated using an appropriate wordline input signal.

The proposed wordline booster circuit is especially preferred for SRAM devices. Other than in a flash memory, where a boosted voltage is needed for writing and therefore has to be kept at a constant high level for a long time, for SRAM cells the boosted voltage is used to improve the performance of the cell. It is sufficient for improving the performance to provide a boosted voltage at the beginning of a read and write cycle of a memory cell respectively. The proposed wordline booster circuit provides the boosted voltage within a very short time. This is favorable, because on-chip SRAM devices run at high frequencies, e.g. much more than 2 GHz.

A further shrink of the SRAM cell, such as six-transistor SRAM cells, with new technology generations, yield a negative impact on the read and write performance due to the smaller device sizes. At least most of this drawback can be compensated. Unfavorable known solutions can be avoided, such as the use of bigger cells to compensate performance loss, whereby more area is needed and the cell does not scale with logic, or the use of a separate, usually higher, power supply voltage for the SRAM cells, whereby power consumption and system costs increase for additional power supply.

Driving the wordline with a high voltage actually overdrives the so-called passgate transistors within the memory cell. The overdrive increases the current the pass-gate transistor can carry. A higher current makes it more easily to read and write the cell, hence improving the cell performance. A possible degradation of the read stability caused by the overdrive can be compensated by changing the size ratio of the passgate as well as the pulldown and pullup devices in the memory cell.

The booster generates a voltage which is higher than the supply voltage to drive the wordline of the arrays. The increased wordline voltage level improves the read and write performance of the array with only a small area penalty—only a small additional chip area is needed for the circuit.

Advantageously, the booster circuit can be switched off without disturbing the inherent SRAM performance. This can be reasonable to reduce the leakage currents or to reduce the overall power consumption.

It is possible to use a smaller SRAM cell or to use a stability optimized, but slower, cell. The performance hit can be almost recovered by the boosted wordline voltage.

Advantageously, the wordline boost voltage is self-adjusting, an additional voltage regulator can be avoided. A simple clamp circuit, for example a diode stack, could be added as a safety device, to limit the maximum allowed boosted current to a value below the breakdown voltage of the transistor gate oxide.

A boosted wordline voltage can be easily blocked by suppressing the clock input signal to the wordline booster circuit. In this case, the wordline is driven by the usual power supply voltage level Vdd. This power saving mode can be convenient when the memory chip is operated at a high voltage. The wordline booster circuit can be switched on by purpose, if the power supply voltage level is too low to reach the performance target of the memory.

In a preferred embodiment, an output of the driving element is connected to the charge storage element and an output of the feedback element is connected to the charging element for switching the charging element from a turned-off state to a turned-on state depending on the activation state of the wordline. This allows for active switching of the charging element.

Further, the feedback element is connected to the output port for supplying the feedback element with the boost voltage.

Preferably, the driving element is a first inverter. The feedback element can be a second inverter. Advantageously, the charging element can be a transistor. This allows for a high boost voltage. It is possible to use a diode instead. The maximum boost voltage is reduced by a certain amount. Preferably, the charge storage element is a capacitor.

The first time interval is a boost phase (active phase), wherein the charge storage element together with the driving element supplies the boost voltage to the wordline-driver circuits and hence the wordlines, and the second time interval is a charging phase, wherein the charge storage element is charged.

Advantageously, the charge storage element is charged during a stand-by mode, while no wordline is activated. After precharging of the charge storage element, preferably one or more capacitors, is finished, no more power is required in stand-by mode, despite of leakage occurring in the charge storage element. The energy stored in the charge storage element is used in an active mode to drive wordlines.

During the stand-by mode, the feedback element switches the charging element into its fully turned-on state.

At least simultaneously or earlier to the activation of at least one wordline, the feedback element can switch the charging element to its turned-off state.

With the charging element in its turned-off state, the output of the driving element together with the charge storage element drives the output port to a higher voltage level than the supply voltage level.

During operation of the memory device, at the end of the boost phase with active wordline, the charging of the charge storage element is resumed.

A memory array implementation on an integrated circuit, arranged on a substrate with wordline booster circuits is proposed, comprising at least an array of rows of memory sub-arrays extending in a longitudinal direction, an array of read/write circuits extending in the longitudinal direction and distributed among the rows of memory sub-arrays, and wordline-driver circuits arranged at one side of each of the memory sub-arrays, wherein at least first sub-circuits of the wordline booster circuits are distributed in a transversal direction among the wordline-driver circuits. The benefit of the proposed arrangement is a possible self-scaling of the arrangement when the array size of the memory array is changed. For example, when the array is increased in height, e.g. more wordlines in transversal direction, there will be more booster circuits connected in parallel, also compensating the changed requirements.

The distributed location of the wordline booster circuits reduces losses due to wiring resistance. The wordline booster circuits are favorably located at positions where all necessary control signals are available anyhow.

Preferably, second sub-circuits assigned to the wordline booster circuits are extending in the longitudinal direction. Favorably, self scaling occurs when the array size of the memory array is changed. A wider array, e.g. longer wordline in longitudinal direction, will also increase the capacitance of the charge storage element, which is preferably a capacitor, compensating the higher wordline capacitance.

The memory array is arranged between two rows of second sub-circuits of the wordline booster circuits. This improves the self-scaling of the arrangement.

Additionally or alternatively, at least one row of second sub-circuits can be extending in a transversal direction to the rows of memory sub-arrays.

In this case, the row of second sub-circuits is juxtaposed to one outside-directing side of the wordline-driver circuits.

Figure 1:
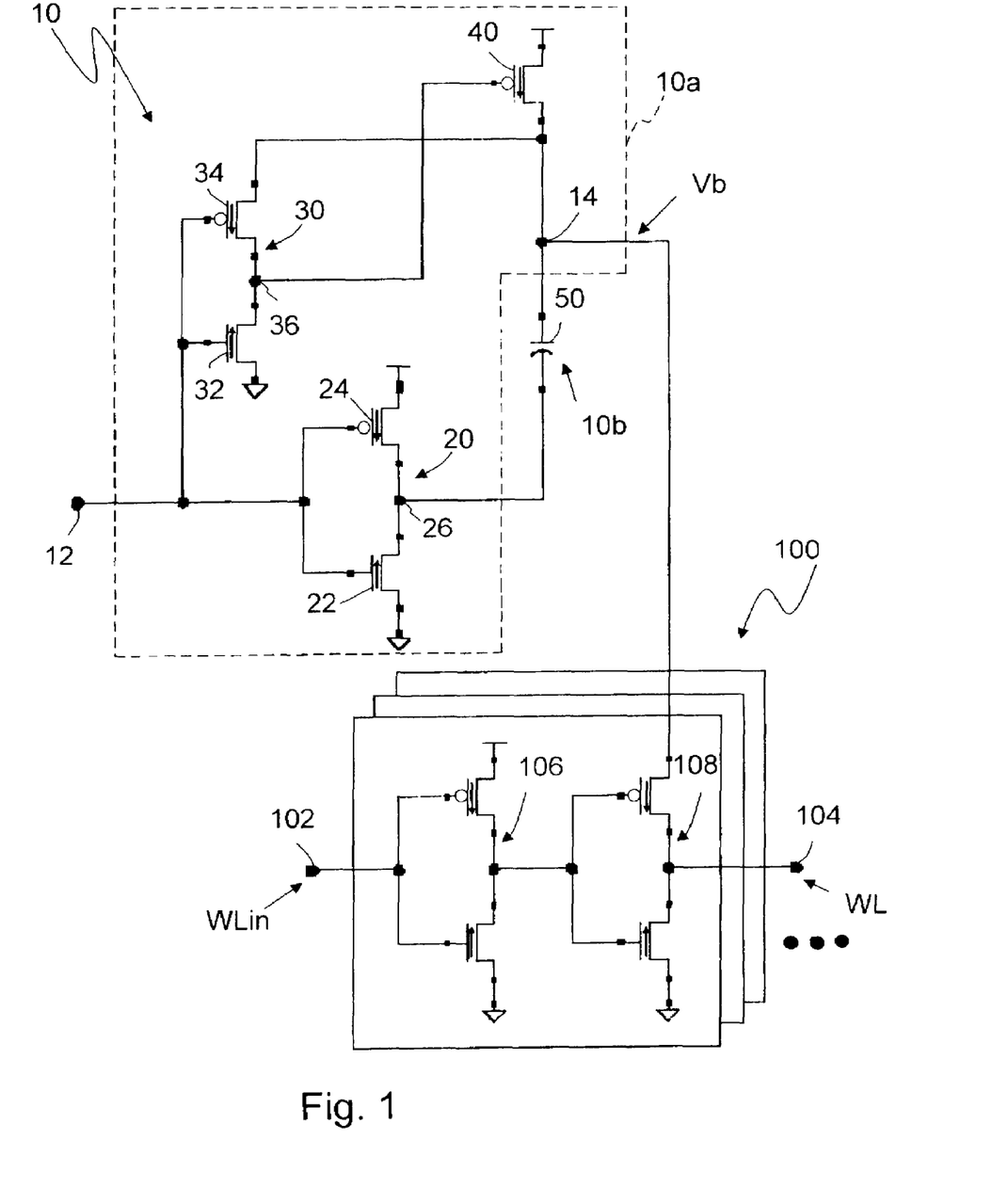
FIG. 1 a preferred wordline booster circuit according to the invention.
Figure 2:
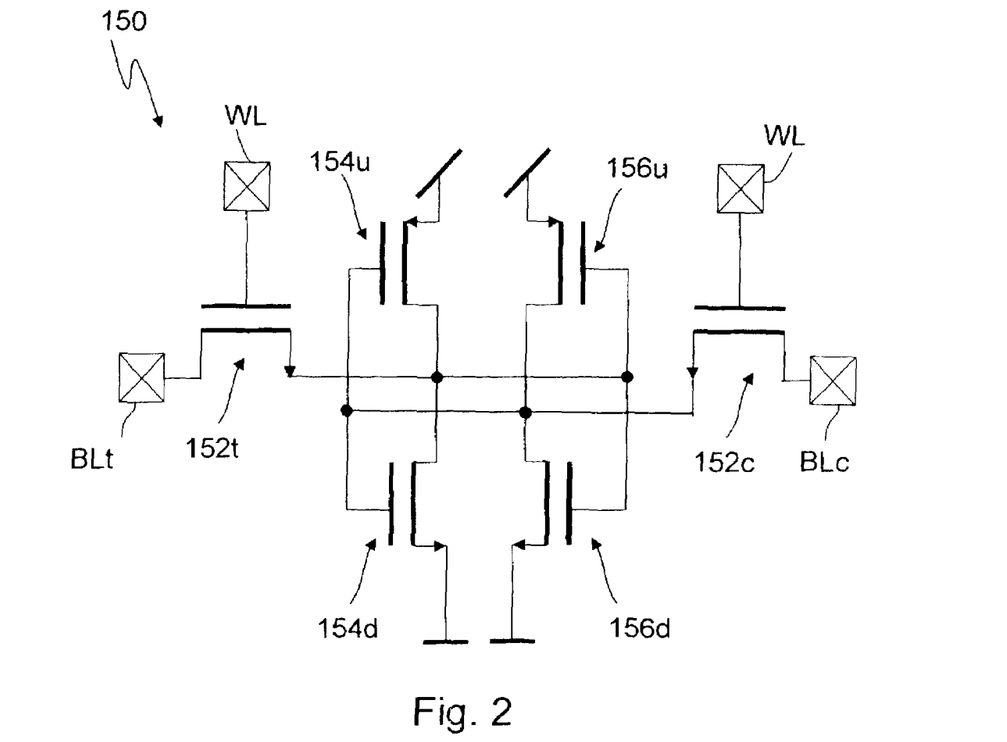
FIG. 2 a six-transistor SRAM cell supplied by a boost voltage.

Preferably, the second sub-circuit is composed of charge storage elements. FIG. 1 depicts a preferred wordline booster circuit 10 connected to a single wordline-driver circuit 100 for a wordline WL of a memory array (not shown). FIG. 2 depicts a six-transistor SRAM cell 150 with a wordline WL and two complementary bitlines 152*t*, 152*c* ("true", "complementary") with a passgate transistor 152*t* for the first bitline BLt and a passgate transistor 152*c* for the complementary bitline BLc and a pair of pullup transistor 154*u* and pulldown transistor 154*d* and a pair of pullup transistor 156*u* and pulldown transistor 156*d*. The wordline WL drives the gate of the passgate transistors 152*t* and 152*c*, which can be overdriven by the boost voltage Vb provided by the wordline booster circuit 10 for generating an improved read and write performance of the SRAM cell 150.

The wordline booster circuit 10 comprises a driving element 20 for shifting a voltage level of a charge storage element 50 for generating a boosted voltage. At output port 14 the boosted voltage Vb is available for at least one wordline-driver circuit 100 of the memory device.

A wordline input signal WLin is fed through an input 102 of the wordline-driver circuit 100 to two inverters 106 and 108 connected electrically in series, and the wordline WL is connected to output 104. The wordline booster circuit 10 is connected to the second inverter 108 of the wordline-driver circuit 100.

The wordline booster circuit 10 further comprises a feedback element 30 for controlling the switching state of a charging element 40, wherein the charging element 40 is actively switchable between a turned-off state during a first time interval and a turned-on state during a second time interval.

The wordline booster circuit 10 can be divided in a first sub-circuit 10*a*, preferably comprising the driving element 20, the feedback element 30 and the charging element 40, and a second sub-circuit 10*b*, preferably comprising the charge storage element 50.

Preferably, the level shifter 20 as well as the feedback element 30 is constituted as an inverter with two transistors 22, 24 and 32, 34 respectively. The drains of the transistors 22, 24, 32, 34 are connected to the outputs 26, 36 of the driving element 20 and the feedback element 30 respectively.

The charging element 40 is preferably constituted as a transistor and the charge storage element 50 is preferably constituted as a capacitor element. The capacitor element can comprise one or more capacitors, depending on the desired boost voltage and/or current.

The output 26 of the driving element 20 is connected to the charge storage element 50 and the output 36 of the feedback element 30 is connected to the gate of the charging element 40 for driving the charging element 40 from a turned-off state to a turned-on state depending on the activation state of the wordline WL.

The source of the transistor 34 of the feedback element 30 is connected to the output 14 for supplying the feedback element 30 with the boosted voltage Vb, wherein the output 14 is located in the electrical connection line between the charging device 40 and the charge storage element 50.

An input signal 12 is fed to the driving element 20 and to the feedback element 30.

During a stand-by mode, when no wordline WL is activated, the clock input signal clk at input 12 is at a logic high level. The output 26 of the level shifter 20, which is connected to the charge storage element 50, consequently is at a logic low level. The output 36 of the feedback element 30 is also at logic low level, causing the charging element 40 to be switched on, connecting the charge storage element 50 to the positive power supply voltage Vdd. Hence the charge storage element 50 becomes charged to Vdd level in this first time interval. During this precharge phase, the charge storage element 50 is charged to Vdd-level using the driving element 20 and the charging element 40.

Simultaneously or some time before a wordline WL should be activated, the input signal clk at input 12 is switched to the logic low level. Hence, the output 36 of the feedback element 30 is now driving the gate of the charging element 40 with a high voltage, actually switching it off. The output 26 of the driving element 20 is switching to Vdd level, too. Due to the charged charge storage element 50, the voltage at output port 14 is now lifted by Vdd, when the bottom pin of the precharged charge storage 50 in the form of a capacitor is connected to Vdd-level, resulting in an absolute voltage level of almost 2·Vdd.

Figure 3:
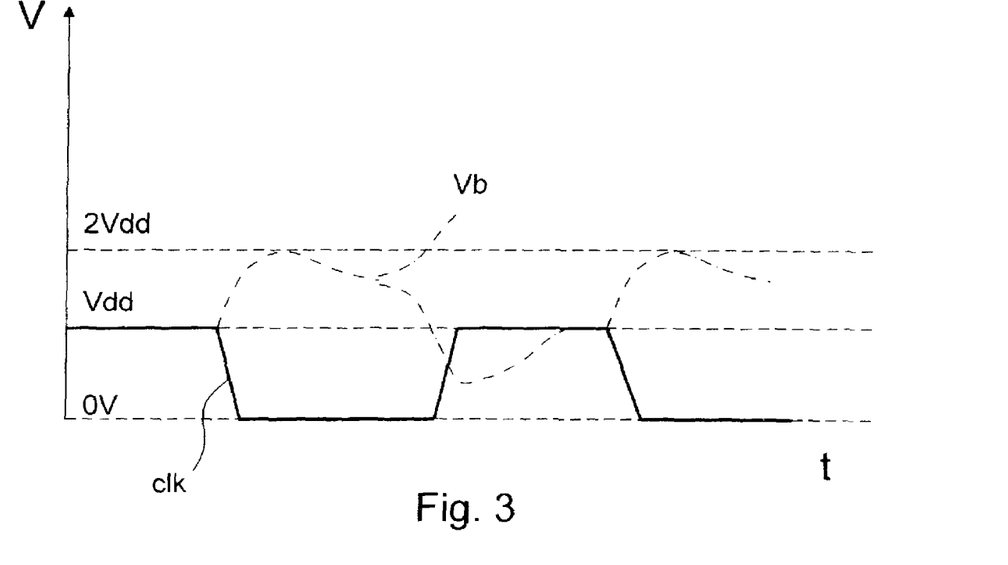
FIG. 3 a time dependency of a voltage at an input of the wordline booster circuit in comparison with a boosted voltage at an output of the wordline booster circuit of FIG. 1.

This voltage shift can be seen in FIG. 3. FIG. 3 shows the internal timing of the wordline booster circuit 10 with time dependent characteristics of the input signal clk (straight line) and the voltage Vb at output 14 (dot-and-dash line) of the cell. The boosted voltage Vb is available at the negative edge of the clock input signal clk fed to the wordline booster circuit 10 during the second time interval. At the same time, at least one of the wordline drivers will be activated using an appropriate wordline input signal WLin. During this boost phase, the boosted voltage Vb cannot drop below Vdd−Vth. As can be easily seen in FIG. 3, the boosted voltage Vb exhibits a peak at the beginning of the boost phase followed by a slow decrease and drops below Vdd at the end of the boost phase. The peak is sufficient to improve the read and write performance of an SRAM memory. When no wordline WL is activated, the charge storage 50 is recharged (and precharged) up to Vdd again.

The boosted output voltage Vb at output 14 is fed to the wordline-driver circuits 100 (FIG. 1), which finally will drive the selected wordline at a higher voltage level. The electrical current needed to drive the wordline WL will start to discharge the charge storage element 50, reducing the boosted voltage Vb. Because in this mode the charging element 40 in the preferred form of a transistor is operated like a diode connected MOS transistor, the voltage can drop down to V≈Vdd−|Vth|, where Vth is the threshold voltage of the charging element 40 in form of a transistor. Therefore, even for long activation times of the selected wordline WL, the wordline WL remains at a high voltage level. At the end of the active wordline phase, the input signal clk at input 12 is switched to the logic high level, starting the charging process of the charge reservoir 50 again.

As shown above, the wordline booster circuit 10 provides an active switching of the charging element 40 in form of a transistor from a diode connected mode during the boost phase and a fully turned-on mode during the charging phase using the feedback element 30 in the preferred form of an inverter. In the diode connected mode the transistor 34 of the feedback element 30 shortcuts the gate and drain of the charging element 40.

Alternatively, it is also possible to use a hard diode connected transistor or a diode as charging element 40. This results in the charge storage element 50 to be charged only to a voltage of Vdd−|Vth|, hence lowering the maximum available boosted output voltage Vb at output 14.

Figure 4:
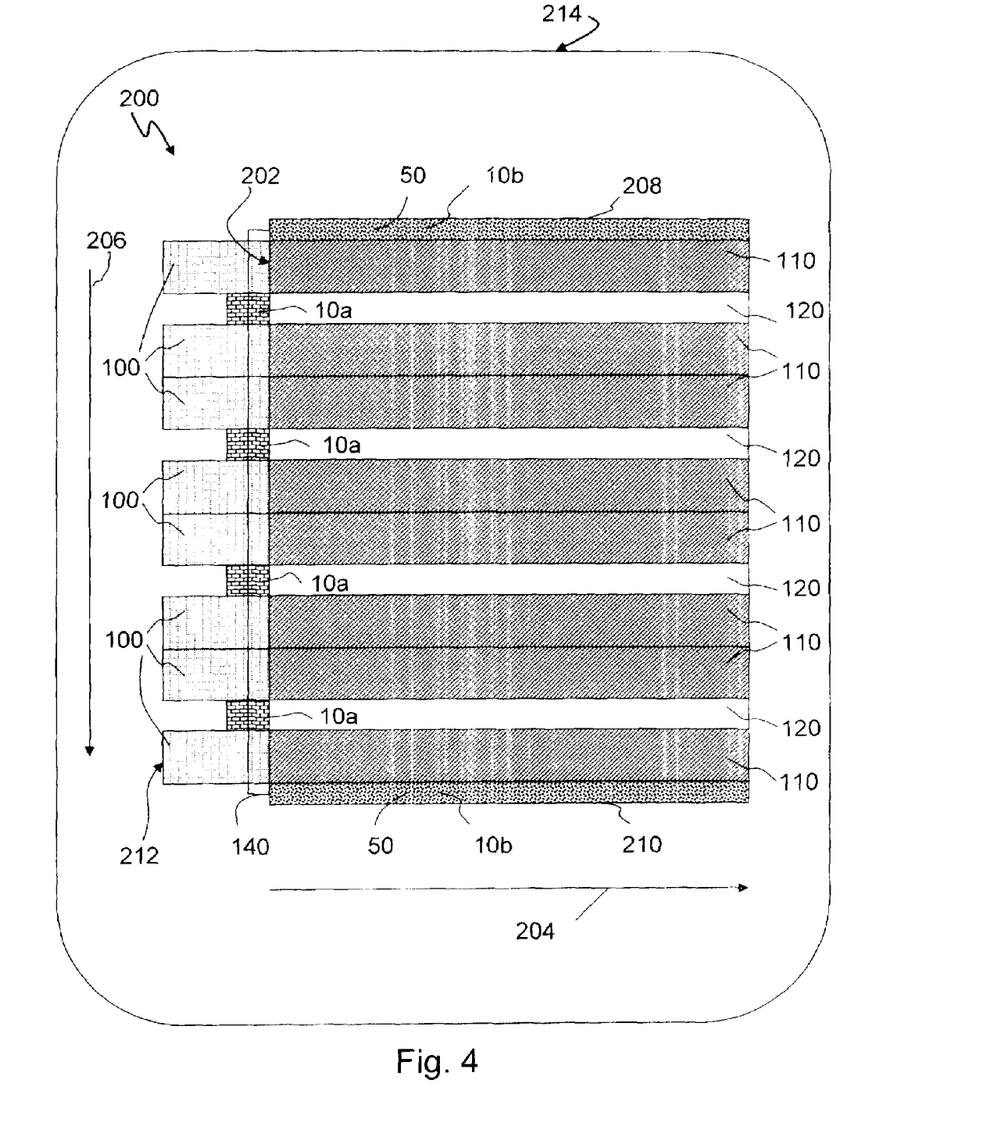
FIG. 4 a first preferred floorplan of an array with integrated wordline booster circuits.
Figure 5:
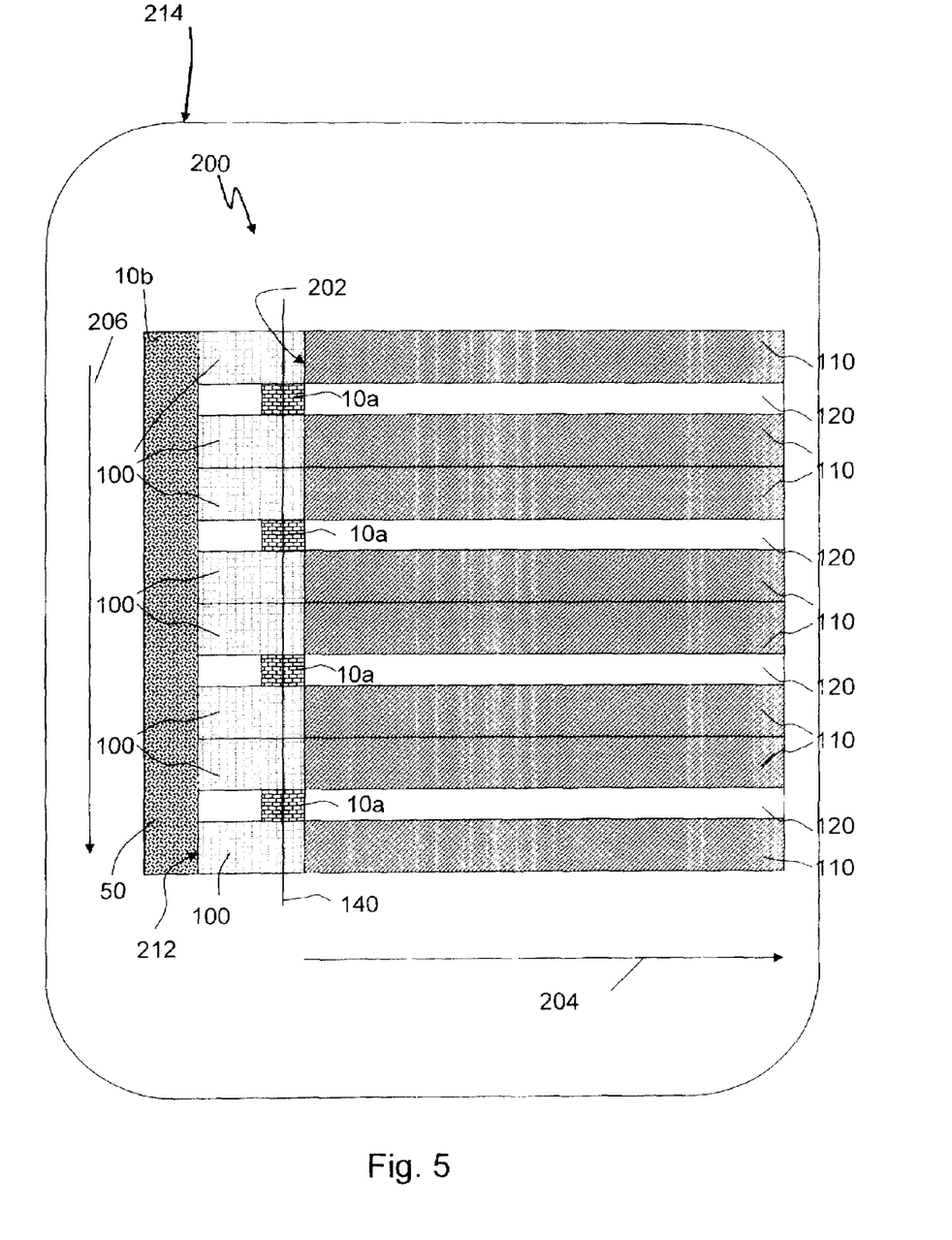
FIG. 5 a second preferred floorplan of an array with integrated wordline booster circuits.

Favorable implementations of a preferred SRAM memory array 200 with SRAM sub-arrays 110 arranged on a substrate 214 are shown in FIGS. 4 and 5. The arrangement shows a so called embedded or on-chip SRAM array. The SRAM memory array 200 is depicted as a floorplan indicating the areas on the substrate of the memory chip which are assigned to various elements and circuits of the memory array. Probable decoder elements etc. are not displayed but can be present.

In principle, the array 200 is arranged in a line-by-line arrangement as in conventional arrays of this kind and circuits are arranged in a matrix-like arrangement in rows and columns. Typically, the sub-arrays 110 comprise a first multitude of rows of wordlines WL (not shown individually) stacked in a vertical (transversal) direction 206, wherein another multitude of memory cells (e.g. such cells 150 as shown in FIG. 2) is located side-by-side in each wordline in the horizontal (longitudinal) direction 204. In the vertical direction 206 the memory cells are arranged in columns. At one side 202 of the sub-arrays 110 wordline drivers 100 are arranged, where typically one wordline-driver circuit 100 is assigned to one wordline. Read/write circuits 120 are located in between the rows of sub-arrays 110. The read/write circuits 120 extend in the longitudinal direction 204.

Such read/write circuits 120 typically comprise first circuits for writing and second circuits for reading the memory cells. Usually for each sub-array 110, one read and one write circuit of the read/write circuits 120 is assigned to one column of memory cells. Wordline-driver circuits 100 are juxtaposed horizontally to the memory sub-arrays 110. At the outer sides 212, 210 and/or 208 elements like decoder circuits, latch elements for read and write operation, logic elements, driver elements etc. can be arranged, but are not displayed.

From the left side 212 of the memory array 200 within one horizontal row wordline-driver circuits 100 are followed by one horizontal row of memory sub-arrays 110 in a longitudinal direction 204. Going down in the vertical direction 206, in the next row wordline booster sub-circuits 10*a* are followed by a row of read/write circuits 120. The sub-circuits 10*a* and 10*b* of the wordline booster circuits 10 (FIG. 1) are located in separate areas of the array 200 and operated in parallel.

The upper and lower outermost rows of memory sub-arrays 110 are each a single row (e.g. 16 wordlines high), whereas in the inner sector of the arrangement two rows of memory sub-arrays 110 are juxtaposed yielding a row of double vertical height of memory sub-arrays 110 (e.g. 32 wordlines high).

First sub-circuits 10*a* of the wordline booster circuits 10 (FIG. 1) are distributed in the vertical direction 206 among the wordline-driver circuits 100. These sub-circuits 10*a* are electrically connected in parallel by an interconnection 140. The longitudinal locations of the sub circuits 10*a* are at the same position with respect to the longitudinal direction 204. The sub circuits 10*a* are shorter than the wordline driver elements 100. In the free space between the rows of wordline driver elements 100 additional circuitry can be juxtaposed to the first sub-circuits 10*a*.

Second sub-circuits 10*b* assigned to the wordline booster circuits 10 are extending in the longitudinal direction 204, wherein the memory sub-arrays 110 are arranged between one row of the second sub-circuit 10*b* at the outermost top side 208 and one row of the second sub-circuit 10*b* at the outermost bottom side 210 of the array 200.

The second sub-circuit 10*b* is preferably composed of charge storage elements 50. The first sub-circuit 10*a* preferably comprises the driving element 20, the feedback element 30 and the charging element 40 as indicated in FIG. 1.

This arrangement yields an automatic self-scaling when the array size of the memory array 200 is changed. A wider array with longer wordlines will also increase the capacitance of the charge storage element 50 (sub-circuit 10*b*), compensating the higher wordline capacitance. When the array grows in vertical height, i.e. the number of wordlines increases, there will be more wordline booster sub-circuits 10*a* connected in parallel, also compensating the changed requirements. The first sub-circuits 10*a* are arranged in positions where all necessary control signals are available anyhow.

FIG. 5 shows an alternative arrangement of the second sub-circuit 10*b*.

A single row of second sub-circuits 10*b* is extending in a vertical direction 206 with respect to the rows of memory sub-arrays 110. The row of second sub-circuits 10*b* is juxtaposed to one outside-directing side 212 of the wordline-driver circuits 100. The distribution of the first sub-circuits 10*a* of the wordline booster circuit 10 is equal to the distribution of the sub-circuits 10*a* depicted in FIG. 4. Again, the first sub-circuits 10*a* are arranged in positions where all necessary control signals are available anyhow.

The additional circuitry shown in FIG. 4 and FIG. 5 requires only a small area and can be easily included in existing integrated circuit designs.

Figure 6:
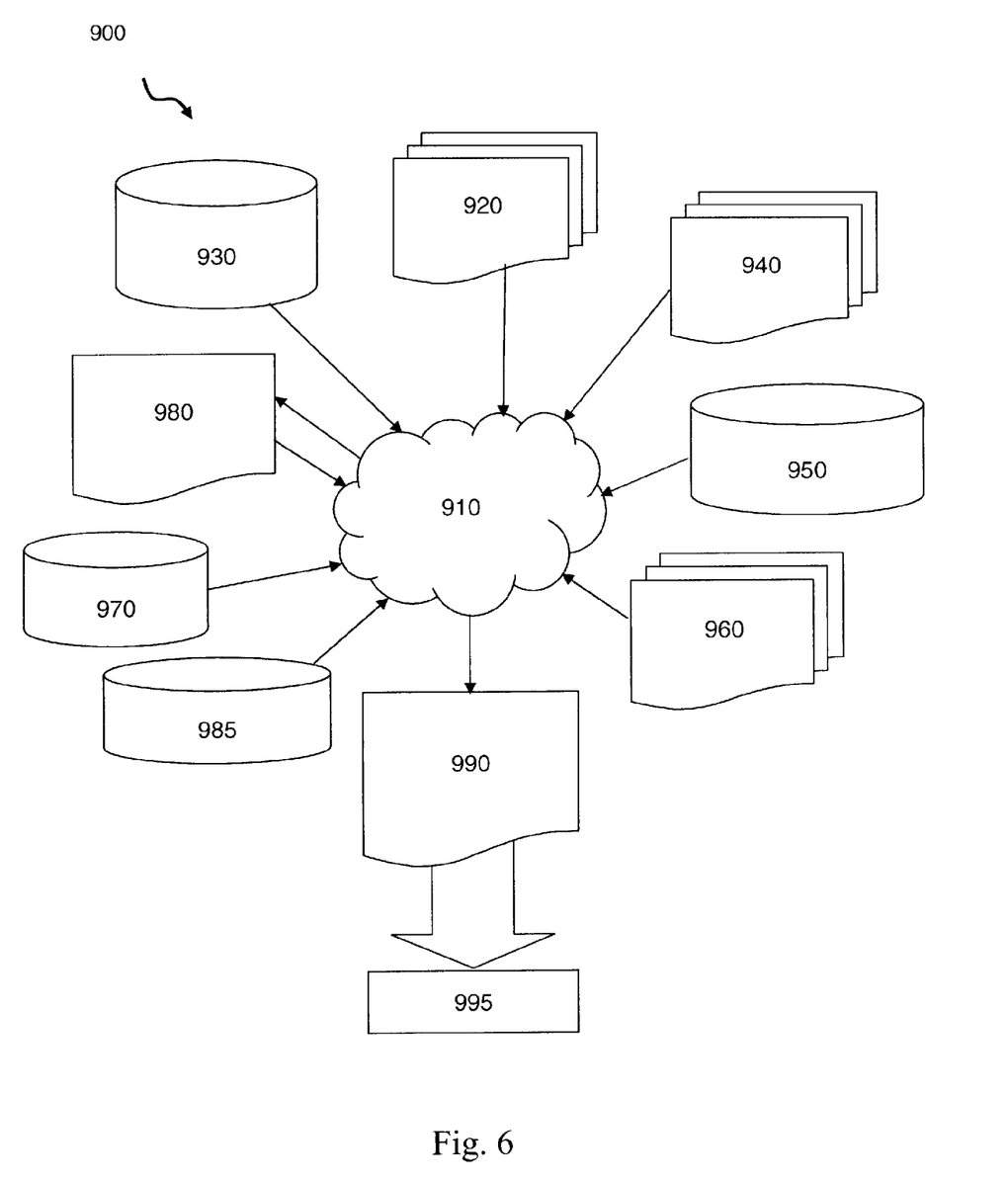
FIG. 6 is a flow diagram of a design process used in semiconductor design, manufacturing, and/or test.

FIG. 6 shows a block diagram of an example design flow 900. Design flow 900 may vary depending on the type of IC being designed. For example, a design flow 900 for building an application specific IC (ASIC) may differ from a design flow 900 for designing a standard component. Design structure 920 is preferably an input to a design process 910 and may come from an IP provider, a core developer, or other design company or may be generated by the operator of the design flow, or from other sources. Design structure 920 comprises the inventive circuits described in the figures in the form of schematics or HDL, a hardware-description language (e.g., Verilog, VHDL, C, etc.). Design structure 920 may be contained on one or more machine readable medium. For example, design structure 920 may be a text file or a graphical representation of the circuit. Design process 910 preferably synthesizes (or translates) the circuits into a netlist 980, where netlist 980 is, for example, a list of wires, transistors, logic gates, control circuits, I/O, models, etc. that describes the connections to other elements and circuits in an integrated circuit design and recorded on at least one of machine readable medium. This may be an iterative process in which netlist 980 is resynthesized one or more times depending on design specifications and parameters for the circuits.

Design process 910 may include using a variety of inputs; for example, inputs from library elements 930 which may house a set of commonly used elements, circuits, and devices, including models, layouts, and symbolic representations, for a given manufacturing technology (e.g., different technology nodes, 32 nm, 45 nm, 90 nm, etc.), design specifications 940, characterization data 950, verification data 960, design rules 970, and test data files 985 (which may include test patterns and other testing information). Design process 910 may further include, for example, standard circuit design processes such as timing analysis, verification, design rule checking, place and route operations, etc. One of ordinary skill in the art of integrated circuit design can appreciate the extent of possible electronic design automation tools and applications used in design process 910 without deviating from the scope and spirit of the invention. The design structure of the invention is not limited to any specific design flow.

Ultimately, design process 910 preferably translates the inventive circuits, along with the rest of the integrated circuit design (if applicable), into a final design structure 990 (e.g., information stored in a GDS storage medium). Final design structure 990 may comprise information such as, for example, test data files, design content files, manufacturing data, layout parameters, wires, levels of metal, vias, shapes, test data, data for routing through the manufacturing line, and any other data required by a semiconductor manufacturer to produce the circuits. Final design structure 990 may then proceed to a stage 995 where, for example, final design structure 990: proceeds to tape-out, is released to manufacturing, is sent to another design house or is sent back to the customer.

What is claimed is:

1. A design structure embodied in a non-transitory machine readable medium and usable by a computer in a process for designing and manufacturing an integrated circuit, the design structure comprising:
    a netlist describing a wordline booster circuit comprising,
        a driving element for shifting a voltage level of a charge storage element for storing at least a part of a charge necessary to generate a boosted voltage (Vb), a feedback element for controlling the switching state of a charging element, wherein the charging element is actively switchable between a turned-off state during a first time interval and a turned-on state during a second time interval, and an output port for supplying the boost voltage (Vb) to at least one wordline-driver circuit of a memory device.

2. The design structure according to claim 1, wherein an output of the driving element is connected to the charge storage element and an output of the feedback element is connected to the charging element for switching the charging element from a turned-off state to a turned-on state depending on the activation state of the wordline (WL).

3. The design structure according to claim 1, wherein the feedback element is connected to the output port for supplying the feedback element with the boosted voltage.

4. The design structure according to claim 1 wherein the driving element is a first inverter.

5. The design structure according to claim 1, wherein the feedback element is a second inverter.

6. A design structure embodied in a non-transitory machine readable medium for designing, manufacturing, or testing an integrated circuit, the design structure comprising a netlist describing:
    a plurality of wordline booster circuits;
    at least one array of rows of memory sub-arrays extending in a longitudinal direction;
    an array of read/write circuits extending in the longitudinal direction and distributed among the rows of memory sub-arrays; and
    wordline-driver circuits arranged at one side of each of the memory sub-arrays, wherein a plurality of first sub-circuits of the wordline booster circuits are distributed among the wordline-driver circuits juxtaposed to the read/write circuits.

7. The design structure according claim 6, also comprising a plurality of second sub-circuits assigned to the wordline booster circuits extending in the longitudinal direction.

8. The design structure claim 6, wherein the memory array is arranged between two rows of second sub-circuits of the wordline booster circuits.

9. The design structure according to claim 6, wherein at least one row of second sub-circuits is extending in a vertical direction to the rows of memory sub-arrays.

10. A design structure embodied in a non-transitory machine readable medium and usable by a computer in a process for designing and manufacturing an integrated circuit, the design structure comprising:
    a netlist describing a wordline booster circuit comprising:
        a driving element for shifting a voltage level of a charge storage element for storing at least a part of a charge necessary to generate a boosted voltage (Vb);
        a feedback element for controlling the switching state of a charging element, wherein the charging element is actively switchable between a turned-off state during a first time interval and a turned-on state during a second time interval; and
        an output port for supplying the boost voltage (Vb) to at least one wordline-driver circuit of a memory device.

* * * * *